United States Patent [19]

Angle

[11] 4,199,691

[45] Apr. 22, 1980

[54] CCD MULTIPLE CHANNEL NETWORK

[75] Inventor: Rodney L. Angle, Somerville, N.J.

[73] Assignee: RCA Corporation, New York, N.Y.

[21] Appl. No.: 916,079

[22] Filed: Jun. 16, 1978

[51] Int. Cl.² .................... G11C 19/28; H01L 29/78; H03K 5/00
[52] U.S. Cl. .......................... 307/221 D; 357/24; 357/91; 307/238; 365/183
[58] Field of Search ............. 357/24; 307/221 D, 238; 365/183

[56] References Cited

U.S. PATENT DOCUMENTS

| | | | |
|---|---|---|---|
| 3,811,055 | 5/1974 | Weimer | 357/24 |
| 3,873,851 | 3/1975 | Weimer | 307/221 C |
| 3,902,186 | 8/1975 | Engeler et al. | 357/24 |
| 3,967,254 | 6/1976 | Kosonocky et al. | 357/24 |
| 3,971,003 | 7/1976 | Kosonocky | 357/24 |
| 4,040,077 | 8/1977 | Tehon | 357/24 |
| 4,134,028 | 1/1979 | Kosonocky et al. | 357/24 |

*Primary Examiner*—Gene M. Munson
*Attorney, Agent, or Firm*—H. Christoffersen; Samuel Cohen

[57] ABSTRACT

Charge-coupled device (CCD) including a plurality of parallel CCD channels and common electrodes extending over these channels for controlling the flow of charge in the channels. Potential barrier regions are located beneath certain of the electrodes in certain of the channels, each pair of barrier regions separated by a normal channel region, and voltages are applied to the electrodes at levels such that charge in a channel containing the barrier regions is trapped and temporarily delayed in the normal channel region between the barrier regions relative to the propagation of charge in a channel not containing barrier regions. The structure is useful, for example, in tree networks for parallel-to-serial signal translation and vice versa.

12 Claims, 9 Drawing Figures

CCD MULTIPLE CHANNEL NETWORK

The invention described herein was made under a contract with the Department of the Navy.

This invention relates to charge-coupled devices (CCD's) and, in particular, to the control of the propagation of charge in such devices.

There are many applications in which it is necessary differentially to control the flow of charge in a plurality of CCD channels. Some examples include networks for parallel-to-serial conversion and vice versa, some forms of readout circuits for CCD memories, some form of readout circuits for CCD imagers, multiplexing and decoding networks, and so on. The present application describes structure suitable for meeting these needs implemented, by way of example, in the form of tree networks.

In the drawing:

FIG. 1 is a plan view of a parallel-to-serial converter embodying the invention;

FIGS. 2 and 3 are sections taken along lines 2—2 and 3—3, respectively, of FIG. 1 and substrate potential profiles illustrating the system operation;

Figure 1:
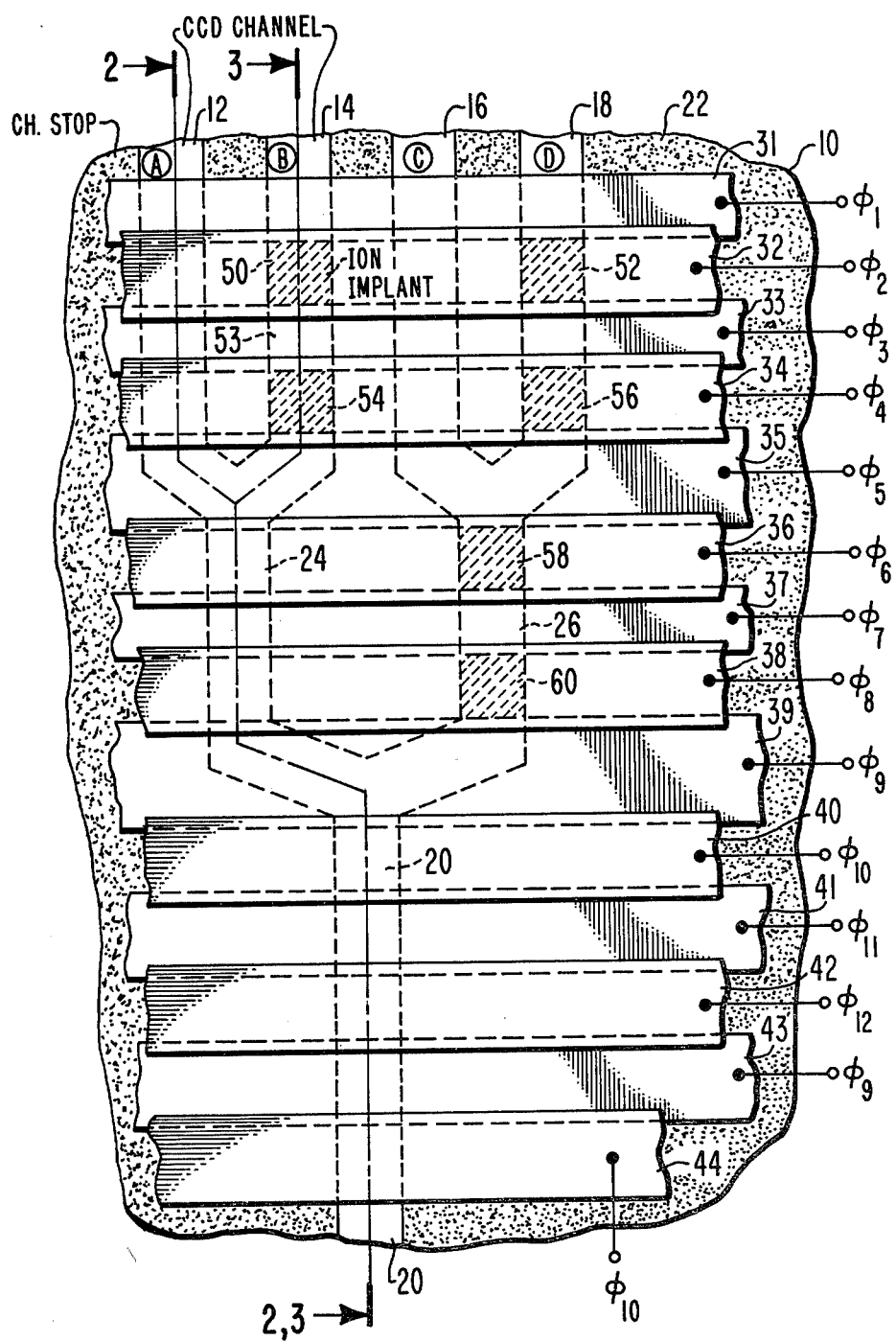

For purposes of the discussion which follows, it is assumed that the CCD illustrated is a buried channel device which comprises a P-type silicon substrate (N-channel) structure and, in the channels, a thin surface layer of N-type silicon. It is to be understood, however, that this is merely illustrative as the inventive teachings also are applicable to P and N channel, surface channel devices and to buried channel N-type substrate devices. The various electrodes are insulated from the substrate by an insulating material such as silicon dioxide. To simplify the drawing, the insulation is indicated in the cross-sectional views by spacing rather than by showing cross-hatched regions. Also, while the invention is illustrated in simplified form, it is to be understood that it is applicable to much more complex systems. For example, while the parallel-to-serial converter of FIG. 1 is shown to include four input channels, it is to be understood that the invention is equally applicable to two or to eight or to sixteen or more input channels.

The parallel-to-serial converter system of FIG. 1, sometimes known as a "multiplexer" includes a P-type substrate 10, four input CCD channels 12, 14, 16 and 18 and an output CCD channel 20. The CCD buried channels may be formed by N-type ion implantations and are defined by channel stop regions such as 22 which are indicated by dots. These are formed of P-type silicon which is more highly doped than the P-type substrate channels, as is well understood in the art. The charge packets in channels 12, 14, 16 and 18 are denoted by the circled characters A, B, C and D, respectively.

The input channels 12 and 14 of FIG. 1 converge to a common channel 24 and the input channels 16 and 18 converge to a second common channel 26. The channels 24 and 26 converge to the output channel 20.

By way of illustration, the electrodes chosen to illustrate the invention may be assumed to be formed of polysilicon and include so-called first and second levels of polysilicon. There are fourteen such electrodes 31–44 illustrated, the odd-numbered ones of these electrodes comprising first (lower) level electrode and the even-numbered ones of these electrodes comprising second (upper) level electrodes. These are located in channels 14 and 18, beneath electrodes 32 and 34, respectively, N— potential barrier regions 50, 54, and 52, 56, respectively. Similarly, in channel 26 N— potential barrier regions 58 and 60 are located beneath electrodes 36 and 38, respectively. These potential barrier regions may be formed by ion implantation and comprise N-type regions which are doped more lightly than the N-type surface layer in the remaining parts of the channels. A region such as 53, which is a normal channel region and is doped more heavily than the surrounding potential barrier regions 50 and 54, is hereafter referred to as a "storage region". The function of a pair of barrier regions is to delay a charge propagated to a storage region between them by temporarily trapping this charge in a manner discussed in detail below.

Figure 6:
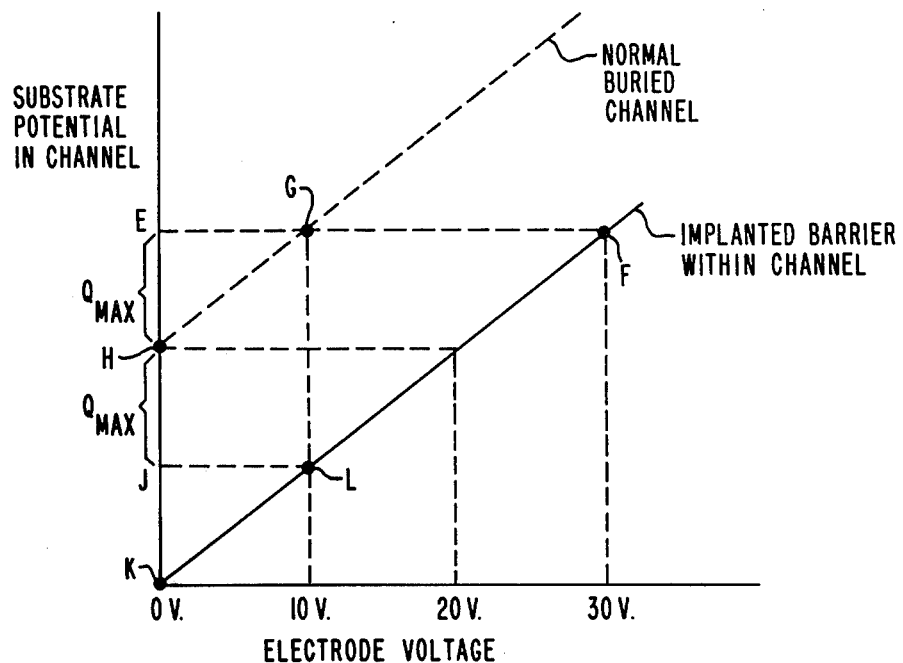
FIG. 6 is a graph showing the substrate potential vs. electrode voltage for different channel regions in FIG. 1.

Both FIGS. 1 and 6 should be referred to next, FIG. 6 showing the substrate potential profile vs. electrode voltage for the implanted barrier regions (solid line) and the normal buried channel regions (dashed line). During the operation to be discussed, the electrodes sometimes are at 0 volts, sometimes are at +10 volts, and sometimes are at +30 volts. The doping level for the implanted barrier regions should be selected to satisfy a number of conditions. During some periods of the operation, a charge packet may be shifted past an ion implanted barrier region such as 50 beneath electrode 32 to a storage region of a channel such as 53 beneath electrode 33 in channel 14. This charge packet in regions 53 will have to be stored for a given time period while the charge packet in an adjacent channel 12 propagates toward channel 24.

The ion implanted barrier region doping level must be such that when the electrode 33 overlying storage region 53 is at 0 volts or 10 volts and the electrodes 32 and 34 overlying the implanted barrier regions 50 and 54 are at 0 or 10 volts, the charge in region 53 cannot pass over the potential barriers present at 50 or 53. FIG. 6 illustrates that this is the case. Note that K represents a high potential barrier, J a lower barrier, H a still lower barrier and so on. With the electrode voltage at 0 volts, a storage region such as 53 has a channel potential of H. With a charge (electrons) of maximum capacity $Q_{MAX}$ stored in this region, the electrons will tend to flow out of the potential well represented by H unless the barriers on each side of this well are higher than J, where H-J represents the change in surface potential due to $Q_{MAX}$. With the overlying electrode at 0 volts, an adjacent implanted barrier region is at a potential K representing a higher potential barrier than J so that the implanted barrier region acts as a barrier to prevent the escape of charge. When the overlying electrode is at +10 volts, the implanted barrier potential is L which, while shown to be aligned with J, actually is slightly below J (represents a higher barrier than J) and therefore acts as a barrier for the prevention of the escape of charge. The latter condition (an electrode overlying an implanted barrier at +10 volts and an electrode overlying an adjacent storage region which is storing charge at 0 volts) is a worst case condition.

It is also clear from FIG. 6 that when an electrode overlying an implanted barrier region is at 10 volts and an electrode overlying a storage region adjacent thereto is also at 10 volts, there is no problem of the escape of charge as the implanted barrier region forms a potential barrier L≅J which is substantially higher than that (E or H) of the adjacent storage region, even when the latter is storing maximum charge.

A second condition which must be satisfied to obtain suitable operation of the structure illustrated is that when the electrode over an implanted barrier region is at 30 volts, then the channel potential beneath that electrode should be approximately equal to the channel potential beneath an adjacent electrode over a storage region region, which adjacent electrode is at 10 volts and contains no charge. Although this condition is not as critical as the first one discussed, the charge transfer efficiency could be decreased if the surface potentials just discussed differed to too great an extent. FIG. 6 illustrates that the second condition is met. Note that when the electrode potential over an implanted barrier region is at 30 volts (intersection F of FIG. 6), the implanted barrier's channel potential is approximately the same as when an electrode over a storage region is at 10 volts (intersection G of FIG. 6).

Figure 2:
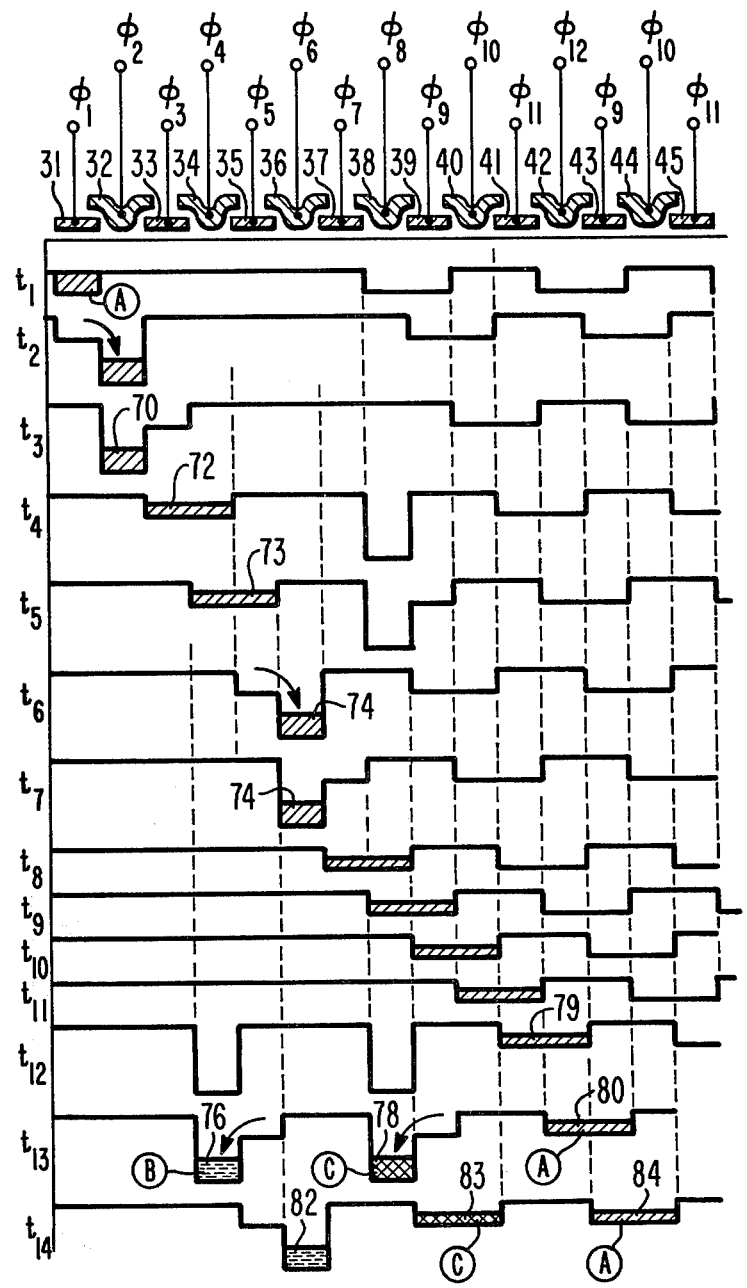
Figure 5:
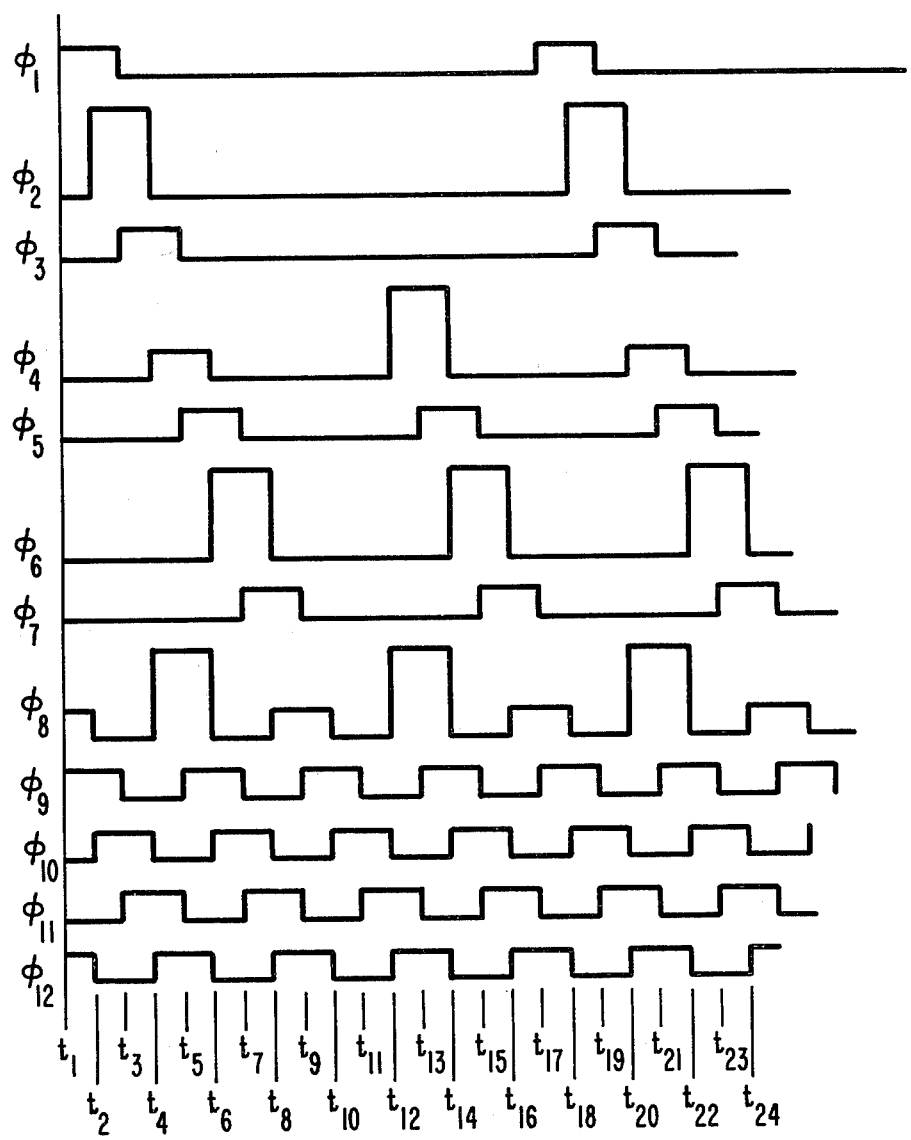
FIG. 5 is a drawing of waveforms employed in the operation of the system of FIG. 1.

In the discussion of the operation which follows, FIGS. 1, 2 and 5 should be referred to. FIG. 2 traces the transfer of a charge packet A down channels 12, 24 and 20. After the discussion of these figures, FIG. 3 will be referred to. It traces the corresponding transfer of a charge packet down channels 14, 24 and 20. It is assumed during this discussion that four charge packets simultaneously are present at the inputs of the four channels. As the system producing the four parallel charge packets forms no part of the present invention, it will not be discussed further. It will be shown in this discussion that the four parallel charge packets are translated by the tree to four serial charge packets which arrive at the output CCD channel 20 in the order A, C, B, D.

At time $t_1$, $\phi_1$ is high at 10 volts and charge packet A is present in channel 12 beneath electrode 31. At time $t_2$, $\phi_2$ is high at 30 volts and charge packet A transfers to beneath electrode 33. At time $t_3$, $\phi_2$ remains at 30 volts and $\phi_3$ changes to 10 volts. The charge packet remains in the deeper potential well beneath electrode 32. At time $t_4$, $\phi_2$ returns to 0, $\phi_3$ remains at 10 volts and $\phi_4$ changes to 10 volts and the charge packet formerly in potential well 70 transfers to the combined potential well 72 beneath electrodes 33 and 34 in channel 12. At time $t_5$, $\phi_3$ goes low, $\phi_4$ remains high and $\phi_5$ goes high so that the charge transfers from well 72 to the combined potential well 73 beneath electrodes 34 and 35. Note from FIG. 1 that this charge is now at the input to common channel 24. It will be shown later that the charge packet B has been delayed in channel 14 and has not yet reached this input point to channel 24.

At time $t_6$, $\phi_6$ goes high to 30 volts and the charge in well 73 transfers to well 74 beneath electrode 36. The charge is now in common channel 24. At time $t_7$, $\phi_6$ remains at 30 volts and $\phi_7$ goes to 10 volts so that the charge remains stored in well 74. The transfer of charge during the periods $t_8$–$t_{11}$ is straightforward and no explanation is needed. By the time $t_{11}$, the charge is stored in the combined potential well beneath electrodes 40 and 41 in the output channel 20.

At time $t_{13}$, $\phi_4$ is high at 30 volts and $\phi_5$ goes high to +10 volts. This set of conditions causes the B charge packet which, as will be shown shortly, was stored beneath electrodes 35 and 34 in channel 14 to move backwards to potential well 76 beneath electrode 34 in channel 12. It will be seen shortly that this does not cause any problem of excessive delay because during the following time period this charge packet will move forward a distance equivalent the length of two electrodes.

At time $t_{13}$, $\phi_8$ is high at 30 volts and $\phi_9$ goes high to +10 volts. This causes the C charge packet which formerly was stored beneath electrodes 39 and 38 of channel 26, to propagate backward to the potential well 78 beneath electrode 38 in channel 24. Again, this backward propagation does not create any problems for the same reasons as discussed in connection with charge packet B.

At time $t_{13}$, $\phi_{12}$ is high and $\phi_9$ goes high, both at 10 volts. This causes the charge which was in potential well 79 to propagate to potential well 80 beneath electrodes 42 and 43. It may be observed from the surface potential profile shown that the charge packets A, C and B are now arranged in that order. The A charge packet is in the common output channel 20, the C charge packet is in the CCD channel 24, having moved backward a space equal to one electrode length. The B charge packet is in channel 12 also having moved backward a distance equivalent to one electrode length. These charge packets are now in the desired order and it will be shown later that the last charge packet will be packet D. It also may be observed that the electrodes following electrode 42 are driven by multiple-phase voltages $\phi_9$–$\phi_{12}$. These are four-phase voltages and are also employed for the electrodes (not illustrated) following electrodes 44 and 45, which are over the common output channel 20. It is, of course, to be appreciated that four-phase operation is given by way of illustration only, as alternatives are possible.

At time $t_{14}$, $\phi_4$ goes low, $\phi_5$ remains high at 10 volts and $\phi_6$ goes high to 30 volts. This causes transfer of the charge packet B from potential well 76 to potential well 82 beneath electrode 36. Referring to FIG. 1, the charge packet has now propagated from channel 12 beneath electrode 34 to common channel 24 beneath electrode 36. At this same time $t_{14}$, $\phi_8$ goes low to 0 volts, $\phi_9$ remains high at 10 volts and $\phi_{10}$ goes high to 10 volts. This causes propagation of the charge packet C from well 78 to well 83. In similar fashion, charge packet A transfers from well 80 to well 84. Note that there is now proper spacing between charge packets C and A and these subsequently will propagate in convention four-phase fashion.

Figure 3:
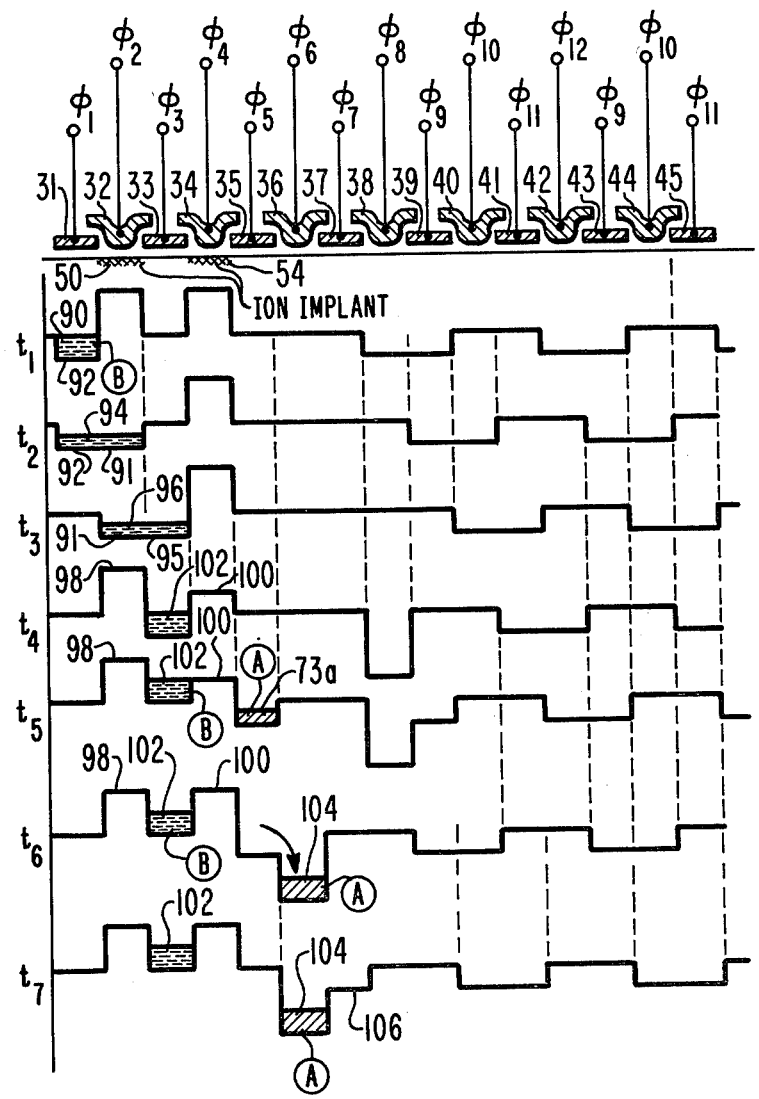

FIG. 3 should be referred to next. It shows what is occurring in channels 14, 24 and 20 during the propagation of the A charge packets just discussed. At time $t_1$, $\phi_1$ goes high and the charge packet B transfers to potential well 90 beneath electrode 31. At time $t_2$, $\phi_2$ goes high to 30 volts creating in the ion-implanted barrier region 50 beneath electrode 32, a surface potential 91 which would be equal to the surface potential 92 beneath electrode 31 in the absence of charge. The surface potential 92 is present because electrode 31 is still at 10 volts. In response to these potentials, the charge packet in potential well 90 beneath electrode 31 transfers to the combined potential well 94 beneath electrodes 31 and 32.

At time $t_3$, $\phi_2$ is still at 30 volts and $\phi_3$ goes high to 10 volts. At the same time, the potential $\phi_1$ goes low to 0 volts. In the absence of charge, the surface potential 91 beneath electrode 32 is equal to the surface potential 95 beneath electrode 33 and a combined potential well 96 is formed into which the charge from potential well 94 transfers.

At time $t_4$, $\phi_2$ goes low to 0 volts, $\phi_3$ remains high at 10 volts, $\phi_4$ goes high to 10 volts and $\phi_5$ is at 0 volts. When $\phi_2$ goes low, a potential barrier 98 is created beneath electrode 32 and although $\phi_4$ is now at +10 volts in view of the ion implanted potential barrier region 54, there is still a potential barrier 100 which is present in the implanted barrier region 54. While barrier 100 is lower than barrier 98, it is still sufficiently high to prevent escape of the charge packet which has moved from the combined potential well 96 beneath electrodes 32 and 33 to the single potential well 102 beneath electrode 33.

At time $t_5$, the potential barriers 98 and 100 remain at their previous levels as $\phi_2$ is still 0 volts and $\phi_4$ is still at +10 volts. The potential well 102 becomes reduced in depth because $\phi_3$ has decreased from +10 volts to 0 volts. However, as may be recalled from the discussion of FIG. 6, even with a charge packet B of maximum amplitude present in well 102, its surface potential does not increase sufficiently to permit any of this charge to flow over the potential barrier 100. Accordingly, the charge remains stored in well 102. At this same time $t_5$, it will be recalled from FIG. 2 that charge is present in the combined potential well beneath electrodes 34 and 35. The portion of the charge beneath electrode 35 is visible at A in the potential well legended 73a which is one half the potential well 73 shown in FIG. 2 at time $t_5$.

At time $t_6$, $\phi_4$ goes low so that the height of potential barrier 100 increases and becomes equal to the height of potential barrier 98 beneath electrode 38. Therefore, charge packet B remains captured in potential well 102 (substrate region 53 of FIG. 1). At time $t_6$, the A charge packet is well 73 transfers to well 104 beneath electrode 36 in response to the voltage $\phi_6$ going from 0 volts to +30 volts. At time $t_7$, $\phi_7$ goes high so as to decrease the surface potential at 106, however, the A charge packet remains stored in potential well 104.

Figure 4:
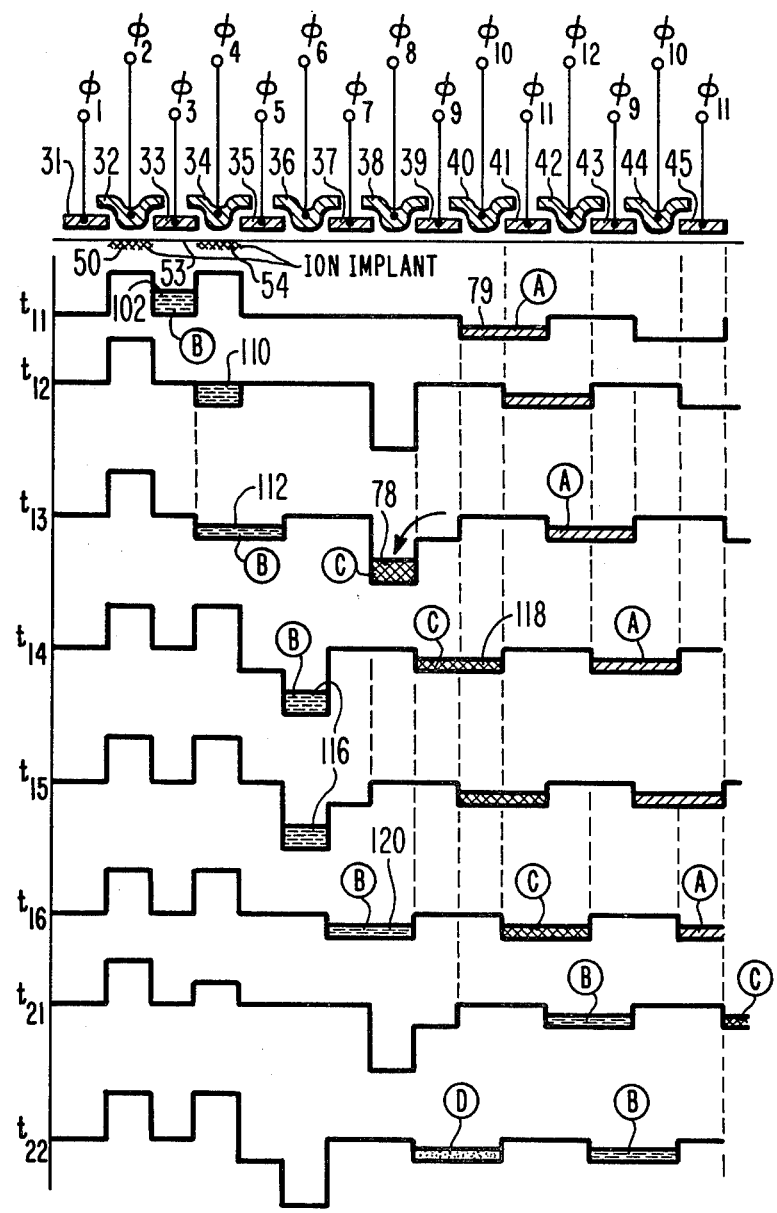
FIG. 4 is also a section through FIG. 1 illustrating other substrate potential profiles which occur during the system operation.

FIG. 4 should now be referred to. It shows what occurs in channels 12, 24 and 20 during the time from $t_{11}$ to $t_{22}$. At time $t_{11}$, the B charge packet still is stored in the potential well 102 at the substrate surface 53 between the ion implanted barrier regions 50 and 54; $\phi_2$, $\phi_3$ and $\phi_4$ are all at 0 volts at this time. The A charge packet is in potential well 79 beneath electrodes 40 and 41 as already discussed in connection with FIG. 2.

At time $t_{12}$, $\phi_3$ remains at 0 volts and $\phi_4$ changes to +30 volts. In response thereto, a potential well 110 is formed in the ion implanted barrier region 54 beneath electrode 34 and the charge in well 102 propagates to well 110. At time $t_{13}$, $\phi_4$ remains at +30 volts and $\phi_5$ changes to +10 volts. This produces a combined potential well 112 of uniform surface potential as already discussed and the charge formerly in potential well 110 now propagates to the combined potential well 112. At this same time the C charge packet which had been present in the potential well beneath electrodes 38 and 39 in channel 26 propagates backward to the deeper potential well 78 beneath electrode 38 in channel 24. Referring back to FIG. 1 it can be seen that this charge packet C is in front of the B charge packet which at time $t_{13}$ is located beneath electrodes 34 and 35 in channel 14. The C charge packet is located behind the A charge packet which at time $t_{13}$ is located beneath electrode 78 in the output channel 20.

At time $t_{14}$, $\phi_6$ goes high to +30 volts and $\phi_5$ remains at +10 volts. At the same time, $\phi_4$ returns from +30 volts to 0 volts. As a result of these various voltages, the B charge packet formerly in well 112 propagates to well 116 beneath electrode 36. At the same time $t_{14}$, voltage $\phi_8$ goes from 30 volts back to 0 volts, $\phi_9$ is at 10 volts and $\phi_{10}$ goes from 0 volts to 10 volts. The 10 volts on electrodes 39 and 40 creates a potential well 118 beneath these electrodes and the charge from potential well 78 moves to potential well 118. The A charge packet at this time is continuing to propagate in the manner illustrated in response to the changes in the voltages $\phi_{12}$, $\phi_9$ and $\phi_{10}$.

At time $t_{15}$, the B charge packet remains stored in well 116 and the C and A charge packets propagate to the right as shown in FIG. 4 (downward as shown in FIG. 1). At time $t_{16}$, $\phi_6$ changes from 30 volts to 0 volts, $\phi_7$ remains at 10 volts, $\phi_8$ changes to 10 volts, $\phi_9$ and $\phi_{10}$ are at 0 volts and so on. The charge formerly in potential well 116 beneath electrode 36 now moves to the potential well 120 beneath electrodes 37 and 38. Thus, the charge is in common channel 24 and is spaced the right distance behind charge packet C which, in turn, is spaced the correct distance behind charge packet A.

The remainder of the surface potential profiles are believed to be more or less self-explanatory. The last potential profile shown which occurs at time $t_{22}$ is included only to show the charge packet D which originated in channel 18. This charge packet is behind charge packet B, as required, and is the correct spacing from charge packet B.

This completes the explanation of a transfer of four parallel charge packets through the converging tree and their conversion to serial charge packets in the process. The operation of channels 16, 18 and 26 is not discussed in detail as it is self-evident from the explanation given of the remaining channels. In a practical system, during the time this transfer is taking place, groups of four additional charge packets are introduced at the input to the tree. The timing is such that empty wells are available at the input end of the trees to accept these charges.

Figure 7:
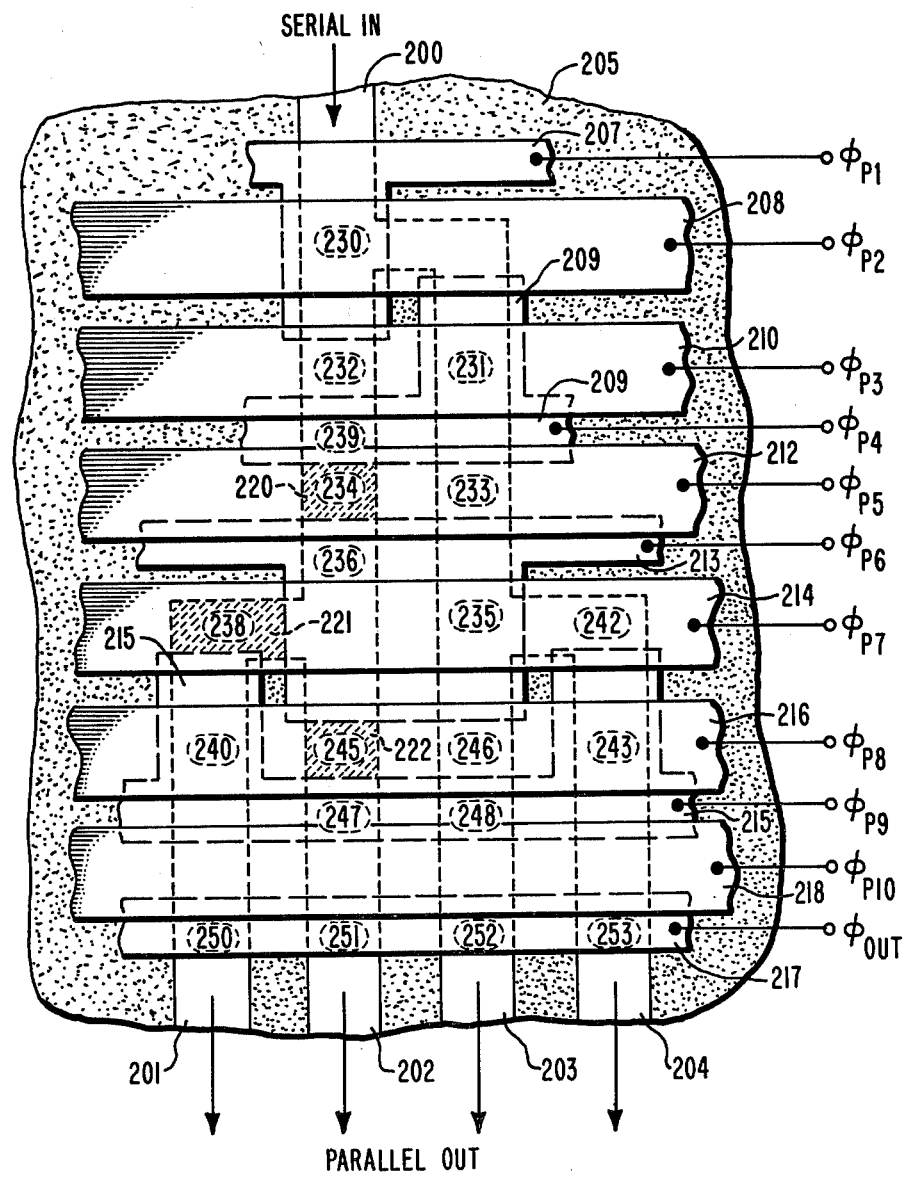
FIG. 7 is a plan view of a charge steering network embodying the invention useful, for example, as a serial-to-parallel converter.

FIG. 7 illustrates an embodiment of the invention suitable for routing incoming serially occurring charge packets to desired ones of four output channels. The CCD may be assumed to be of the same type as discussed in connection with FIG. 1, that is, a P-type substrate buried channel device with an overlying N surface layer in the channel regions. There is a single input channel 200 receiving charge packets A, B, C and D, in that sequence, and four output channels 201–204, respectively. As in the previous case, the channels are defined by channel stop regions 205, shown stippled. The propagation of charge down the various channels is controlled by potentials applied to a group of electrodes 207–218, the odd-numbered ones of these electrodes comprising lower-level electrodes and the even-numbered ones, upper-level electrodes. It is assumed for purposes of this discussion that all electrodes are spaced the same distance from the substrate at their closest regions to the substrate, as in the first CCD discussed. As already mentioned, the channels comprise P-type substrate regions and overlying N-type regions which may be formed by ion implantation. In addition, there are potential barrier regions shown at 220, 221, 222 comprising N-type regions which are more lightly doped than the N-type channel regions. These serve a purpose similar to the potential barrier regions of FIG. 1.

Figure 9:
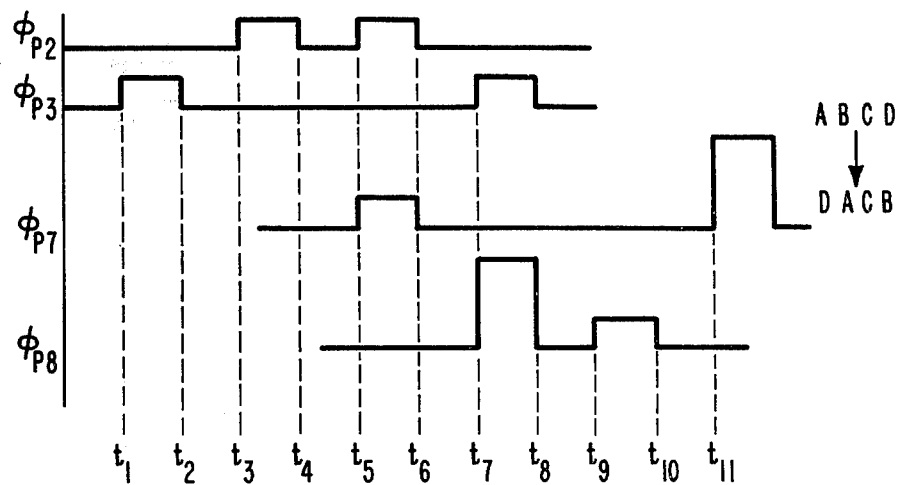
FIGS. 8 and 9 are drawings of waveforms to help explain the operation of FIG. 7.
Figure 8:
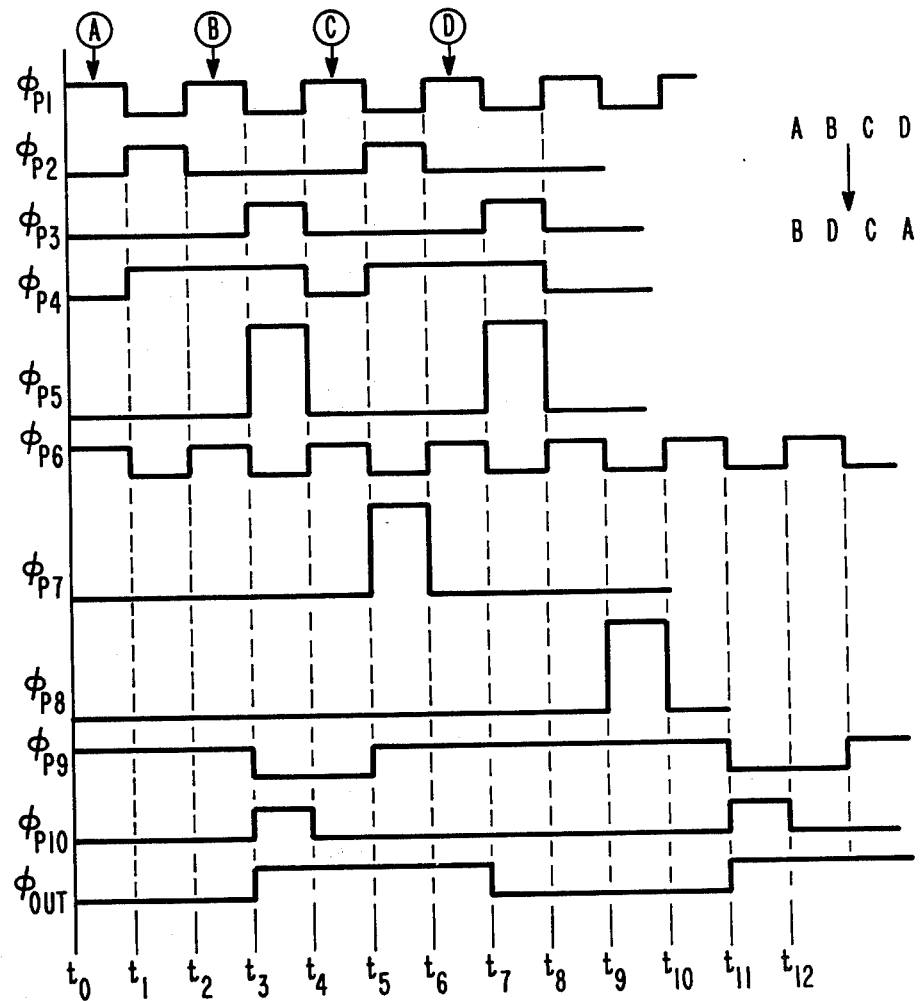

It is possible, using the structure of FIG. 7, to route the incoming charge packets A, B, C and D to any one or more of the output channels. For example, the incoming charge packets may be routed to the four output channels, in any desired channel order. It is also possible to route all the incoming charge packets to any one of the output channels or to route some of the charge packets (i.e., A and B) to one output channel, C to another output channel and D to another, and so on. The routing of the charge packets to the output channels is controlled by the multiple-phase control voltages $\phi_{P1}$ through $\phi_{POUT}$. FIG. 8 shows one set of control voltages, this one for routing the packets A, B, C and D into four different output channels, B to 201, D to 202, C to 203 and A to 204. These packets are present concurrently beneath output electrode 217 so this operation is serial-to-parallel conversion. FIG. 9 shows the modifications needed to obtain the serial ABCD to parallel DACB conversion. There are many other possibilities.

Referring now to FIGS. 7, 8 and 9, when $\phi_{P1}$ goes high at time $t_0$, the incoming charge packet A propagates to the potential well 230 in channel 200 beneath electrode 207. A potential well is indicated in FIG. 7 by a number within a dashed oval. At time $t_1$, $\phi_{P2}$ and $\phi_{P4}$ go high and $\phi_{P1}$ goes low transferring the A charge packet from potential well 230 to potential well 231 beneath electrode 209.

At time $t_2$, charge packet B arrives and propagates to potential well 230 beneath electrode 207. Charge packet A remains in potential well 231.

At time $t_3$, $\phi_{P3}$ goes high to +10 volts causing charge packet B to transfer from potential well 230 to the combined potential well 232, 239 beneath electrodes 210 and 209, respectively. At the same time $\phi_{P5}$ goes high to 30 volts. This causes a potential well 234 to form in the barrier region 220 beneath electrode 212 which is of the same depth as potential wells 232 and 239. Accordingly, the B charge packet becomes stored in the combined potential wells 232, 239, 234.

At time $t_3$, when $\phi_{P5}$ goes high to 30 volts, the charge packet A in potential well 231 propagates to the deeper potential well 233 beneath electrode 212.

At time $t_4$, $\phi_{P1}$ goes high to +10 volts and the C charge packet propagates to potential well 230 beneath electrode 207. At the same time $\phi_{P6}$ goes high and $\phi_{P3}$, $\phi_{P4}$ and $\phi_{P5}$ go low so that the B charge packet formerly in combined potential wells 232, 239, 234 becomes stored in potential well 236 beneath electrode 213. Also, the A charge packet in well 233 propagates to potential well 235 beneath electrode 213.

At time $t_5$, $\phi_{P2}$ and $\phi_{P4}$ go high to +10 volts so that the C charge packet propagates to potential well 231 beneath electrode 209. At time $t_5$, $\phi_{P7}$ goes high to +30 volts. At the same time, $\phi_{P6}$ goes low to 0 volts. Accordingly, charge packet B which was in well 236 beneath electrode 213 propagates to potential well 238 in the barrier region 221 beneath electrode 214. $\phi_{P9}$ goes high to +10 volts at time $t_5$. This creates a potential well 240 beneath electrode 215 of the same depth as the well 238. Accordingly, charge packet B becomes stored in the combined potential well 238, 240.

When $\phi_{P7}$ goes high to 30 volts and $\phi_{P6}$ goes low at time $t_5$, the A charge packet propagates from potential well 235 to potential well 242 beneath electrode 214. When $\phi_{P9}$ goes high to +10 volts at time $t_5$, this does not affect the A charge packet which remains in the deep well 242 beneath electrode 214.

Summarizing, at time $t_5$ the C charge packet is in potential well 231, the B charge packet in potential well 238, 240 and the A charge packet is in potential well 242.

At time $t_6$, $\phi_{P1}$ goes high and the D charge packet transfers to potential well 230 beneath electrode 207. At time $t_6$, $\phi_{P7}$ goes low while $\phi_{P9}$ remains high so that the B charge packet formerly in the combined potential well 238, 240 propagates to potential well 240 beneath electrode 219. When $\phi_{P7}$ goes low, as $\phi_{P9}$ is high the A charge packet propagates from well 242 to well 243 beneath electrode 215. The C charge packet remains in well 231.

At time $t_7$, $\phi_{P3}$ goes high to 10 volts, $\phi_{P5}$ goes high to 30 volts, and $\phi_{P1}$ goes low. This causes the D charge packet to transfer from potential well 230 to the combined well 239, 234. Charge packets A and B remain in their respective wells 243 and 240. Charge packet C is transferred from potential well 231 to potential well 233 since the potential level in 233 is greater than in 231.

At time $t_8$, $\phi_{P3}$, $\phi_{P4}$ and $\phi_{P5}$ go low as $\phi_{P6}$ goes high and this causes the D charge packet to transfer from the combined wells 232, 239, 234, to potential well 236 and the C charge packet to transfer from potential well 233 to potential well 235 beneath electrode 213.

At time $t_9$, $\phi_{P8}$ goes high to +30 volts and the D charge packet transfers from potential well 236 to the combined potential 245 and 247, since the potential level of 245 under electrode 216 with the barrier implant 222 is the same as the potential level of 247 under electrode 215 without a barrier implant. Concurrently, the C charge packet transfers from potential well 235 to potential well 246 beneath electrode 216.

At time $t_{10}$, $\phi_{P8}$ goes low causing the D charge packet to be completely transferred to potential well 247 beneath electrode 215 and the C charge packet is transferred from potential well 246 beneath electrode 216 to potential well 248 beneath electrode 215. All charge packets are now ready for transfer out of the CCD structure. The transfer is accomplished at time $t_{11}$ by making $\phi_{P10}$ and $\phi_{OUT}$ high (+10 volts) and $\phi_{P9}$ low. This causes the B charge packet to transfer from potential well 240 to potential well 250, the D charge packet to transfer from potential well 247 to potential well 251, the C charge packet to transfer from potential well 248 to potential well 252 and the A charge packet to transfer from potential well 243 to potential 253.

FIG. 9 illustrates the $\phi_{P2}$, $\phi_{P3}$, $\phi_{P7}$ and $\phi_{P8}$ waveforms required to effect the serial-to-parallel conversion of ABCD to DACB, where D is present in channel 201, A in 202 and so on. Note that waveform $\phi_{P8}$ is at 30 volts from $t_7$ to $t_8$ and at 10 volts from $t_9$ to $t_{10}$. The other waveforms are as shown in FIG. 8. In view of the discussion of FIG. 8, the reader should be able to follow the charge propagation process without further explanation.

With further modification of the various control voltages, it is possible to operate in other charge steering modes. In general, the voltages $\phi_{P1}-\phi_{P4}$, $\phi_{P6}$ and $\phi_{P9}-\phi_{POUT}$ will vary between levels 0 and 10 volts but the times during which the various waves are at the different levels depend upon where it is desired that the charge be steered. The wave $\phi_{P5}$ varies between levels 0 and +30 volts and again the times this wave is at these different levels is controlled in accordance with the function being performed. The waves $\phi_{P7}$ and $\phi_{P8}$ can vary between three different levels, 0, +10 and +30 volts, and also the times selected for the 0, 30, and 10 volt levels (if 10 volts is used) are controllable in accordance with the particular charge steering function desired.

What is claimed is:

1. A charge-coupled device (CCD) comprising:
   a semiconductor substrate;
   first and second substantially parallel channels in said substrate, extending in a given direction, each channel comprising a substrate region and means creating potential barriers which define the opposite edges of each channel;
   a plurality of electrodes common to said channels extending in a direction which is generally transverse to said given direction, said electrodes being insulated from the channels and being responsive to applied potentials for producing parallel wells in the channels for the storage in and propagation of charge along the respective channels, said electrodes including first, second and third adjacent electrodes, arranged in that order;
   first and third potential barrier regions in said first channel, beneath said first and third of said electrodes, respectively, each said region having an impurity concentration such that the potential barrier created is lower than the potential barrier defining the channel edges, said first and third electrodes being spaced from one another by the intervening second one of said electrodes;
   a second region in said first channel beneath said second electrode, said second region comprising a normal channel region and being located between said first and third potential barrier regions;
   fourth, fifth and sixth normal channel regions, in said second channel, beneath said first, second and third electrodes, respectively; and
   means for applying multiple-phase voltages to said first, second, third and following electrodes, during one group of sequential time periods, of values for shifting one charge packet, when present in said second channel through said fourth, fifth and sixth regions, and for concurrently shifting another charge packet, when present in said first channel, from said first to said second region and trapping the same in said second region, and for then applying multiple-phase voltages to said first, second, third and following electrodes, during a second group of sequential time periods, of values for shifting said another charge packet out of said second region and through said third region.

2. A CCD as set forth in claim 1 wherein said CCD comprises a buried channel CCD, that is, a CCD having channels comprising a surface layer of one conductivity type over a substrate of opposite conductivity type and wherein said potential barrier regions are of the same conductivity type as the surface layer and are more lightly doped than the surface layer.

3. A CCD as set forth in claim 1, further including:
   another group of said electrodes, adjacent the group comprising said first, second and third electrodes, over at least said second channel; and
   means for applying multiple-phase voltages to said another group of electrodes, during a third group of sequential time periods, between said first and second groups of time periods, for shifting said one charge packet beyond said sixth region prior to the time said another charge packet reaches said third region.

4. A CCD as set forth in claim 3 wherein at least a portion of said second channel over which said second group of electrodes lie, comprises a channel which is a common path for the propagation of said one and said another charge packets, said first channel being joined to said common path at a point beyond said third region.

5. A charge-coupled device (CCD) comprising:
   a semiconductor substrate;
   a first channel and N additional channels, all in the substrate and all extending in the same general first direction, the first channel being joined to the N channels, and each channel comprising a substrate region and means creating potential barriers which define the opposite edges of each channel, where N is an integer equal to at least 2;
   a plurality of electrodes extending in a second direction which is generally transverse to said first direction, said electrodes being insulated from the channels and being responsive to applied potentials for producing potential wells in the channels for the storage in and propagation of charge along the respective channels, at least adjacent first, second, third and following ones of said electrodes passing over said channels;
   first and second potential barrier regions in at least one of said N channels, beneath said first and third of said electrodes, respectively, each said region having an impurity concentration such that its potential barrier is lower than the potential barriers defining the channel edges, said first and third electrodes being spaced from one another by the intervening second one of said electrodes;
   a second storage region in said one channel beneath said second electrode, said second region comprising a normal channel region and being located between said first and third potential barrier regions;
   fourth, fifth and sixth normal channel regions, in another of said N channels, beneath said first, second and third electrodes, respectively; and
   means for applying multiple-phase voltages to said first, second and third and following electrodes during one group of sequential time periods, of values for shifting one charge packet, when present in said another channel through said fourth to said fifth to said sixth region, and for concurrently shifting another charge packet, when present in said one channel, from said first to said second region and trapping the same in said second region, and for then applying multiple-phase voltages to said first, second, third and following electrodes, during a second group of sequential time periods, for shifting said another charge packet from said second region through said third region.

6. A CCD as set forth in claim 5 wherein said first channel comprises an input channel respective of sequential charge packets and said N channels comprise output channels, and said first, second and third electrodes being arranged in that order with said first electrode closest of the three to said first channel.

7. A CCD as set forth in claim 6 wherein said N channels comprise input channels receptive of N charge packets, respectively, in parallel, and said first, second and third electrodes being arranged in that order with said third electrode the closest of the three to said first channel.

8. A charge-coupled device (CCD) comprising:
   a semiconductor substrate which includes a first channel which extends between an input and a first output region and a second channel having an input region joined to the first channel and extending from said input region of said second channel to a second output region, each such channel being defined by potential barriers in the substrate at the opposite edges of each channel; and
   a plurality of gate electrodes insulated from the substrate to which potentials may be applied for selectively controlling the storage and propagation of charge in the respective channels, said electrodes including:
   a first gate electrode substantially entirely over the first channel in the region thereof where the second channel joins the first channel for controlling the propagation of charge to said region;
   a second electrode extending over the input region of said second channel, adjacent to said first electrode, responsive to an applied voltage for controlling the propagation of charge stored beneath said first electrode into the input region of said second channel;
   a third electrode over said first channel, adjacent to said first electrode, and beyond the region thereof where the second channel joins the first channel, responsive to an applied voltage for controlling the propagation of charge stored in the substrate region beneath the first electrode to the substrate region of the first channel beneath said third electrode;
   a fourth electrode common to the first and second channels and adjacent to the second and third electrodes, responsive to an applied voltage for propagating charge in the second channel to a region in the second channel beneath the fourth electrode, and for propagating charge in the first channel to a region in the first channel beneath the fourth electrode; and
   wherein said first and second channels both extend generally in a column direction, wherein said first and fourth electrodes are lower-level electrodes and said second and third electrodes are upper-level electrodes, said second and third electrodes extending in a row direction substantially orthogonal to said column direction, said second electrode extending over said first electrode and being shielded from said first channel by said first electrode, said third electrode extending over said fourth electrode and being shielded from said second channel by said fourth electrode.

9. A CCD as set forth in claim 8, wherein said fourth electrode includes a first portion over said second channel which extends in the column direction and a second portion over said first channel which extends in the row direction and meets said second portion.

10. A charge-coupled device (CCD) comprising:
    a semiconductor substrate which includes first, second, third and fourth channels, all extending generally in a column direction, said first channel having an input region and being joined to an intermediate point along said second channel at its input region and said fourth channel having an input region and being joined to an intermediate point along said third channel at its input region, each such channel being defined by potential barriers in the substrate at the opposite edges of each channel; and
    a plurality of gate electrodes insulated from the substrate to which potentials may be applied for selectively controlling the storage and propagation of charge in the respective channels in response to applied voltages, said electrodes including:
    a first electrode over the second and third channels in the regions thereof where they are joined by the first and fourth channels, respectively, for propagating charges, when present, to the regions of the second and third channels underlying this electrode;
    a second electrode adjacent to and insulated from said first electrode, over said input regions of said first and fourth channels, and shielded from said second and third channels by said first electrode, responsive to an applied voltage for controlling the propagation of charge from the second channel to the input region of the first channel, and from the third channel to the input region of the fourth channel;
    a third electrode common to all four channels, having a first region over the first channel adjacent to said second electrode, a second region over said second channel spaced from said first electrode, a third region over said third channel spaced from said first electrode, and a fourth region adjacent to said second electrode;
    a fourth electrode over said second and third channels in the space between said first and third electrodes, and being shielded from the first and second channels by the first and fourth regions of said third electrode, said fourth electrode being responsive to an applied voltage for control controlling the substrate potential of the regions of said second and third channels underlying the third electrode; and
    said third electrode being responsive to an applied voltage for controlling the propagation of charge in said first and fourth channels from the input regions thereof to regions thereof beneath said third electrode, and for controlling the propagation of charge in said second and third channels to regions thereof beneath said third electrode.

11. A CCD as set forth in claim 10, further including at the input region of said first channel beneath said second electrode, means creating a substrate barrier potential which is higher than the corresponding substrate potential of said input region of said fourth channel, whereby charge will transfer from said third channel into said input region of said fourth channel at a lower voltage applied to said second electrode than is required to effect a transfer of charge from said second channel to the input region of said first channel.

12. A CCD as set forth in claim 11, further including, in the region of said second channel beneath said third electrode, means creating a substrate barrier potential which is higher than that in the corresponding region of said third channel.

* * * * *

UNITED STATES PATENT AND TRADEMARK OFFICE
CERTIFICATE OF CORRECTION

PATENT NO. : 4,199,691

DATED : April 22, 1980

INVENTOR(S) : Rodney Lee Angle

It is certified that error appears in the above-identified patent and that said Letters Patent is hereby corrected as shown below:

Column 1, line 13, "form" should be --forms--.

Column 3, line 18, delete "region" (first occurrence).

Column 5, line 42, "is" should be --in--.

Column 5, line 46, delete "remain".

Column 9, line 22, "parallel" should be --potential--.

Column 12, line 39, delete "control".

Signed and Sealed this

Twenty-second Day of July 1980

[SEAL]

Attest:

SIDNEY A. DIAMOND

Attesting Officer

Commissioner of Patents and Trademarks